(12) United States Patent
Pfannenberg et al.

(10) Patent No.: US 8,951,322 B2
(45) Date of Patent: Feb. 10, 2015

(54) FILTER FAN

(75) Inventors: Andreas Pfannenberg, Hamburg (DE); Tobias Reutter, Horstmar (DE); Wolfgang Lodweg, Münster (DE)

(73) Assignee: Pfannenberg GmbH, Hamburg (DE)

( * ) Notice: Subject to any disclaimer, the term of this patent is extended or adjusted under 35 U.S.C. 154(b) by 394 days.

(21) Appl. No.: 11/904,827

(22) Filed: Sep. 28, 2007

(65) Prior Publication Data

US 2011/0005177 A1 Jan. 13, 2011

(30) Foreign Application Priority Data

Oct. 6, 2006 (DE) .......................... 10 2006 047 316

(51) Int. Cl.
| | | |
|---|---|---|
| *B01D 50/00* | (2006.01) | |
| *H05K 7/20* | (2006.01) | |
| *B01D 45/08* | (2006.01) | |
| *B01D 46/00* | (2006.01) | |
| *B01D 46/10* | (2006.01) | |
| *F04D 29/70* | (2006.01) | |

(52) U.S. Cl.
CPC ............ *H05K 7/20181* (2013.01); *B01D 45/08* (2013.01); *B01D 46/0031* (2013.01); *B01D 46/10* (2013.01); *B01D 50/002* (2013.01); *F04D 29/703* (2013.01); *B01D 2279/45* (2013.01)
USPC ................ 55/385.6; 55/320; 55/332; 55/467; 55/471; 55/501; 454/184; 361/695; 361/830

(58) Field of Classification Search
USPC .......... 55/385.6, 385.7, 385.4, 410, 413, 423, 55/467, 471, 472, 482, 486, 487, 501, 55/DIG. 31, 490–519, 521, 528, 315–337, 55/385.1–385.8; 454/184; 96/188–192, 96/236–241, 301–321; 361/676–678, 361/679.45–679.6, 688–723, 830
See application file for complete search history.

(56) References Cited

U.S. PATENT DOCUMENTS

| | | | | |
|---|---|---|---|---|
| 3,973,620 | A | * | 8/1976 | Stringer .......................... 165/42 |
| 4,087,197 | A | | 5/1978 | Haugen |
| 4,172,865 | A | * | 10/1979 | Steier .............................. 261/62 |
| 4,437,867 | A | * | 3/1984 | Lerner ............................ 96/297 |

(Continued)

FOREIGN PATENT DOCUMENTS

| | | |
|---|---|---|
| DE | 3230511 A1 | 2/1984 |
| DE | 4013645 A1 | 5/1991 |

(Continued)

*Primary Examiner* — Thomas McKenzie
(74) *Attorney, Agent, or Firm* — Lucas & Mercanti, LLP; Klaus P. Stoffel

(57) ABSTRACT

A filter fan of a switch cupboard or of an electrical and/or electronic device placed in a casing with a blast producing an air flow and with a filter element (3) which is placed in the air flow and separates a clean side, on which the blast is placed, from an unclean side, wherein the filter element is held in a frame which can be fixed on the casing by covering the air passage opening penetrating through the casing wall and wherein a protective grid (4) is placed between the filter element (3) and the blast, the invention proposes that a bridging-free distance is provided between the filter surface of the filter element (3) and the protective grid (4), wherein this distance is dimensioned so as to make possible the discharge of water drops on the clean side surface of the filter element and to avoid a contact of the water drops with the protective grid.

17 Claims, 5 Drawing Sheets

(56) References Cited

U.S. PATENT DOCUMENTS

| | | | |
|---|---|---|---|
| 4,465,499 A * | 8/1984 | Wawro et al. | 55/481 |
| 4,494,597 A * | 1/1985 | Fukami et al. | 165/41 |
| 4,581,988 A * | 4/1986 | Mattei | 454/70 |
| 5,080,699 A * | 1/1992 | Ho et al. | 96/129 |
| 5,179,727 A * | 1/1993 | Imagawa | 455/182.3 |
| 5,221,520 A * | 6/1993 | Cornwell | 422/122 |
| 5,433,772 A * | 7/1995 | Sikora | 96/87 |
| 5,554,416 A * | 9/1996 | Scheufler et al. | 427/378 |
| 5,951,725 A * | 9/1999 | Vross et al. | 55/356 |
| 6,110,245 A * | 8/2000 | Schlag et al. | 55/385.6 |
| 6,110,250 A * | 8/2000 | Jung | 55/522 |
| 6,544,309 B1 * | 4/2003 | Hoefer et al. | 55/283 |
| 6,552,900 B1 * | 4/2003 | Hoefer et al. | 361/695 |
| 6,632,133 B2 * | 10/2003 | Barber et al. | 454/158 |
| 6,699,301 B1 * | 3/2004 | Eisenhauer | 55/471 |
| 6,776,706 B2 * | 8/2004 | Kipka et al. | 454/184 |
| 6,875,255 B2 * | 4/2005 | Alford et al. | 95/273 |
| 7,112,232 B2 * | 9/2006 | Chang et al. | 55/481 |
| 7,258,715 B2 * | 8/2007 | Cox et al. | 55/422 |
| 2001/0037630 A1 * | 11/2001 | Eom | 55/467 |
| 2002/0036886 A1 * | 3/2002 | Negishi | 361/645 |
| 2002/0088346 A1 * | 7/2002 | Baracchi et al. | 96/134 |
| 2002/0173265 A1 | 11/2002 | Kipka et al. | |
| 2004/0112023 A1 * | 6/2004 | Choi | 55/486 |
| 2005/0005582 A1 * | 1/2005 | Gieseke et al. | 55/330 |
| 2006/0005518 A1 * | 1/2006 | Duffy et al. | 55/497 |
| 2006/0053759 A1 * | 3/2006 | Winters et al. | 55/497 |
| 2007/0283672 A1 * | 12/2007 | Fu | 55/385.6 |
| 2008/0121107 A1 * | 5/2008 | Pfannenberg | 96/417 |
| 2009/0185348 A1 | 7/2009 | Bretschneider et al. | |

FOREIGN PATENT DOCUMENTS

| | | |
|---|---|---|
| DE | 202006006441 U1 | 7/2006 |
| DE | 202006010888 U1 | 9/2006 |
| EP | 1 098 692 | 5/2003 |
| ES | 2038466 T3 | 7/1993 |

* cited by examiner

FILTER FAN

BACKGROUND OF THE INVENTION

1. Field of the Invention

The present invention relates to a filter fan.

2. Description of the Related Art

Filter fans are known is practice. The filter means, in particular a nonwoven mat, is held in a frame which is closed to the outside by a covering grid and to the blast by a protective grid, whereby the nonwoven mat is held between both grids and adheres to both grids. The filter fans are used for example in switch cupboards and in other casings, namely in a cut-out of the respective casing wall in order to cool electrical or electronic components placed in the casing. This being, it is provided to keep the dust charge as low as possible in order not to reduce unintentionally the cooling power by a dust layer which is depositing on the electrical components. Moreover, the blasts have usually comparably low performances so that the pressure drop at the filter insert is to be held as low as possible in order not to reduce unadmittedly the cooling power due to the filter agent itself. Finally, a protection against moisture is provided against jet water, in particular for devices for example for telecommunication which are placed in halls of companies but which are, for example, placed in the open.

In practice, constructions which have a class of protection IP 54 have proved to be efficient. A higher protection against moisture can be achieved, for example, by filter membranes as they are known from the EP 1 098 692 B1. However, such filter membranes have the disadvantage that they cause a comparably high pressure drop and have in particular a low dust capacity. Moreover, the corresponding filter membranes are laminated which has a disadvantageous economic influence on the fabrication of the filters. In particular, when certain properties are provided for, which either the carrier material or the membrane itself does not have, the respective material must be equipped correspondingly, whereby the equipment eventually of two components of the laminate before the laminating procedure is complicated and eventually makes the laminating procedure more difficult and can thus again have a disadvantageous economical influence.

SUMMARY OF THE INVENTION

The object of the invention is to improve a filter fan in such a manner that it can be produced as economically as possible, that it makes possible an air throughput as high as possible for a low necessary blast power and a low differential pressure and that it guarantees a protection against moisture as high as possible and a high dust capacity.

In accordance with the invention spaces the filter element from the protective grid as far as moisture which penetrated in a low quantity through the filter element because of its pore size can now flow out without pressure on the clean side of the filter element which is turned to the blast without coming into the blast. Distance webs or the like through which the flowing out moisture could be guided from the filter element to the protective grid are avoided so that the spacing is realized bridging-free. In this manner a comparably cheap filter element can be used which offers a high air permeability because of its high pore volume. If an undesired moisture should arrive through the filter element because of the high pore volume, it can flow out without any risk—as described above, so that the desired protection against moisture for the blast and thus for the whole filter fan is made possible.

The bridging-free distance between the filter surface and the protective grid is provided in particular in the area of the passage of air where otherwise the air flow sucked by the blast could transport the moisture from the filter surface to the protective grid or could make such a transport easier.

Advantageously, the filter element can have a mean pore size of at least 20 µm, in particular advantageously between 20 µm and 50 µm so that on the one hand a good filtering performance, in particular dust recovery, can be guaranteed. However, on the other hand a pressure drop as low as possible takes place so that a high air throughput through the filter fan is made possible and thus an excellent cooling performance by means of the filter fan.

In a particularly simple and cheap configuration of the filter fan, it can provided that the distance which the filter element and in particular its filter surface has with the protective grid is defined by an edge area of the filter element. The filter element is inserted in the frame of the filter fan in a manner known in itself. The frame usually has studs or a peripheral edge or the like which extends parallel to the surface of the filter element, which edge or studs bear on the filter element in its peripheral edge area. Due to the fact that a stud is provided on the edge of the filter element, a distance between the filter surface and the edges or the studs of the frame can be achieved which correspondingly also defines a distance between the filter element and in particular its filter surface and the protective grid on the other hand.

In a particularly simple and economically advantageous configuration this edge area of the filter element which defines the distance can be formed by a material strip which is lined onto the filter element. Usually such material strips are used anyway in order to reinforce the filter element and according to this proposal it is only necessary to configure this material strip which is provided anyway wider by a few millimeters so that this material strip forms the edge area of the filter which defines the distance of the filter surface from the protective grid of the filter fan.

Advantageously, the filter element can be configured as a folded filter. In this manner a very big filter surface is made possible with very small constructional dimensions of the filter element. Due to this comparably big filter surface, the average pore size of the filter element can be dimensioned comparably small in order to guarantee a good filter performance and thus a high retaining power for the dust to be filtered out of the air so that a better filter performance can be achieved as for the filter nonwoven mat known from the practice.

The support of the filter element configured as a folded filter in the frame can take place in a simple manner with so-called sealing webs which are provided on the frame and on which the folded filter is mounted, the sealing webs extending in folds of the filter element. Both most outer folds of the filter element are advantageously provided in order to make possible a usable filter surface which is as big as possible so that the sealing webs are provided spaced as far from each other as possible on the frame.

When the filter element of the filter fan is in its use position and the filter fan is placed correspondingly in its use position on the casing, for example in a switch cupboard, the folds of the filter element can advantageously extend vertically so that moisture which passes through the filter element and which accumulates on the rear side of the filter element to small drops can flow out particularly easily and with a low resistance on the filter element.

When the distance of the filter element from the protective grid is defined by a material strip, as mentioned above, for a configuration of the filter element as a folded filter, advantageously two such material strips can be provided, these strips extending transversely to the folds direction and being provided on the two opposite edges of the folded filter. In this manner, a flexibility of the filter element which would otherwise exist due to the multitude of the folds in one direction is reduced so that due to the material strips the filter element on the whole can be manipulated more easily, for example during its mounting in the filter fan.

Advantageously, the filter element can be constituted by a single-layer material width, for example by a filter paper or a polyester nonwoven. Contrary to multiple layer materials, for example laminates, the production of the filter element from a single layer material width is considerably more economical so that the configuration of the filter fan can take place as cheap as possible and in particular the filter elements which must be regularly maintained and replaced can be produced in this manner as economically as possible so that the maintenance costs of the filter fan can be kept as low as possible.

Advantageously, the filter element can be configured hydrophobic and/or flame retardant. Due to the water-repellent character, on the one hand the stability of the filter element is guaranteed and a swelling of the material used for the filter element is avoided so that properties of the filter element such as pore size and differential pressure are not influenced disadvantageously by the moisture influence. The flame retardant configuration improves the safety of the filter fan.

Advantageously, the frame can have water outlet openings on its lower side so that water flowing out on the filter element from the filter fan can be discharged by these water outlet openings. This being, the water outlet openings are preferably configured in such a manner that the water is discharged to the unclean side, thus cannot arrive to the blast or to the electronic parts which are placed in the casing in which the filter fan is.

Advantageously, the frame can influence positively the press fit of the filter element in that studs turned to the filter element are provided on the frame. In particular when the frame is movable for maintenance purposes, when it is provided for example tilting or swivellable on the rest of the filter fan, it can be assured by this press fit that on the one hand the filter element can be replaced in a comfortable manipulation position and the frame can then be moved back from its filter replacement position or maintenance position into its position of use and it is assured during these motions that the filter element remains at the place provided for it inside the frame so that afterwards, when the frame is in its position of use, the reliable function of the filter fan and in particular of the filter element is guaranteed.

Advantageously, a covering grid is placed in a manner known in itself on the unclean side of the filter element which, on the one hand, makes possible a mechanical protection of the filter element and of the blast and which, on the other hand, is configured in such a manner that it makes difficult the penetration of moisture, in particular of jet water, into the filter fan. For this purpose, it can be provided in a manner known in itself to configure the covering grid in form of several lamellae which let air passage openings free between themselves. This being, the lamellae are placed oblique in order to avoid the penetration in particular of water which arrives from above obliquely onto the covering grid. This being, it can advantageously be provided to provide the lamellae respectively on their upper side with a moisture barrier which is configured as a rib which extends along the lamella on the upper side thereof. Contrary to an oblique orientation of the single lamellae, due to this additional flow resistance for moisture which eventually tends to rise on the lamella, an additional flow resistance is created so that the penetration of moisture into the filter fan, namely behind the covering grid, is made difficult.

It can be particularly advantageously provided to orientate the rib on the upper side of the lamella in the type of a barb, thus extending to the unclean side, this being seen in cross section, so that the effect of the moisture barrier is increased and that a normal water main drain is formed.

Advantageously, a water discharge channel can be provided on the lower side of the frame. This channel can be configured preferably as a siphon. Water which arrives behind the filter element which gutters down and arrives into this water discharge channel is thus reliably led out by the blast. With the configuration of the water discharge channel as a siphon, the water automatically closes the water discharged channel so that a reliable dust closure is created against dust penetrating from outside. This being, the configuration of the siphon is made preferably in adaptation to the blast performance so that it is reliably excluded that moisture from the water discharge channel is sucked by a negative pressure produced by the blast.

The various features of novelty which characterize the invention are pointed out with particularity in the claims annexed to and forming a part of the disclosure. For a better understanding of the invention, its operating advantages, specific objects attained by its use, reference should be had to the drawing and descriptive matter in which there are illustrated and described preferred embodiments of the invention.

DESCRIPTION OF THE PREFERRED EMBODIMENTS

Figure 1:
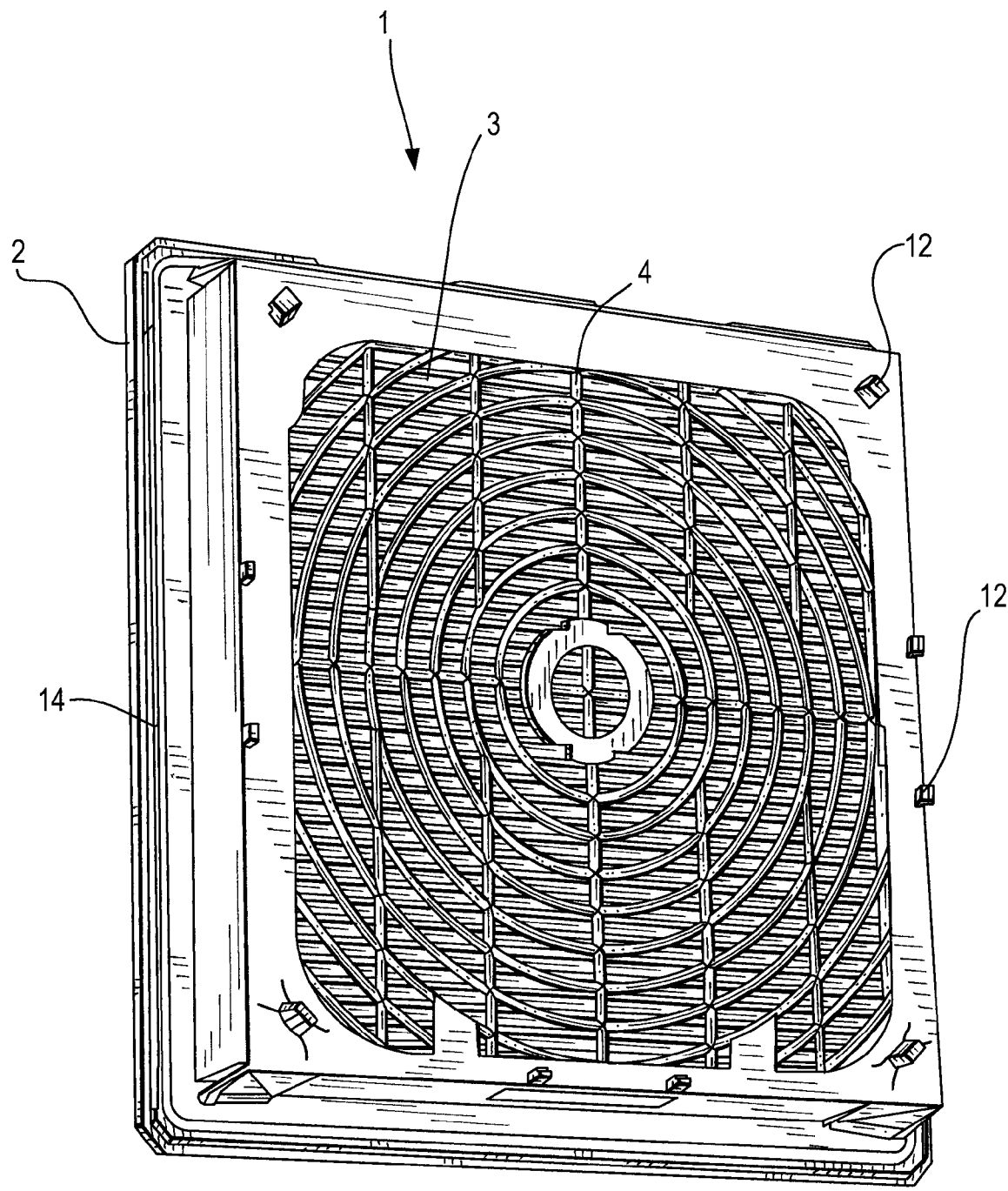
FIG. 1 shows a frame of a filter fan seen from the clean side.

In FIG. 1, a protective cover of a filter fan is designated on the whole by 1. The protective cover 1 has an outer covering grid 2, turned off the observer of FIG. 1, whereby only the rear side of a peripheral frame can be seen. Furthermore, the protective cover 1 has a filter element 3 which is configured as a folded filter and is covered by a rear protective grid 4 which is on the clean side of the filter element 3. The blast of the filter fan is provided behind the protective grid in flow direction of the air, thus on the side of the protective cover 1 which is turned to the observer in FIG. 1.

Figure 2:
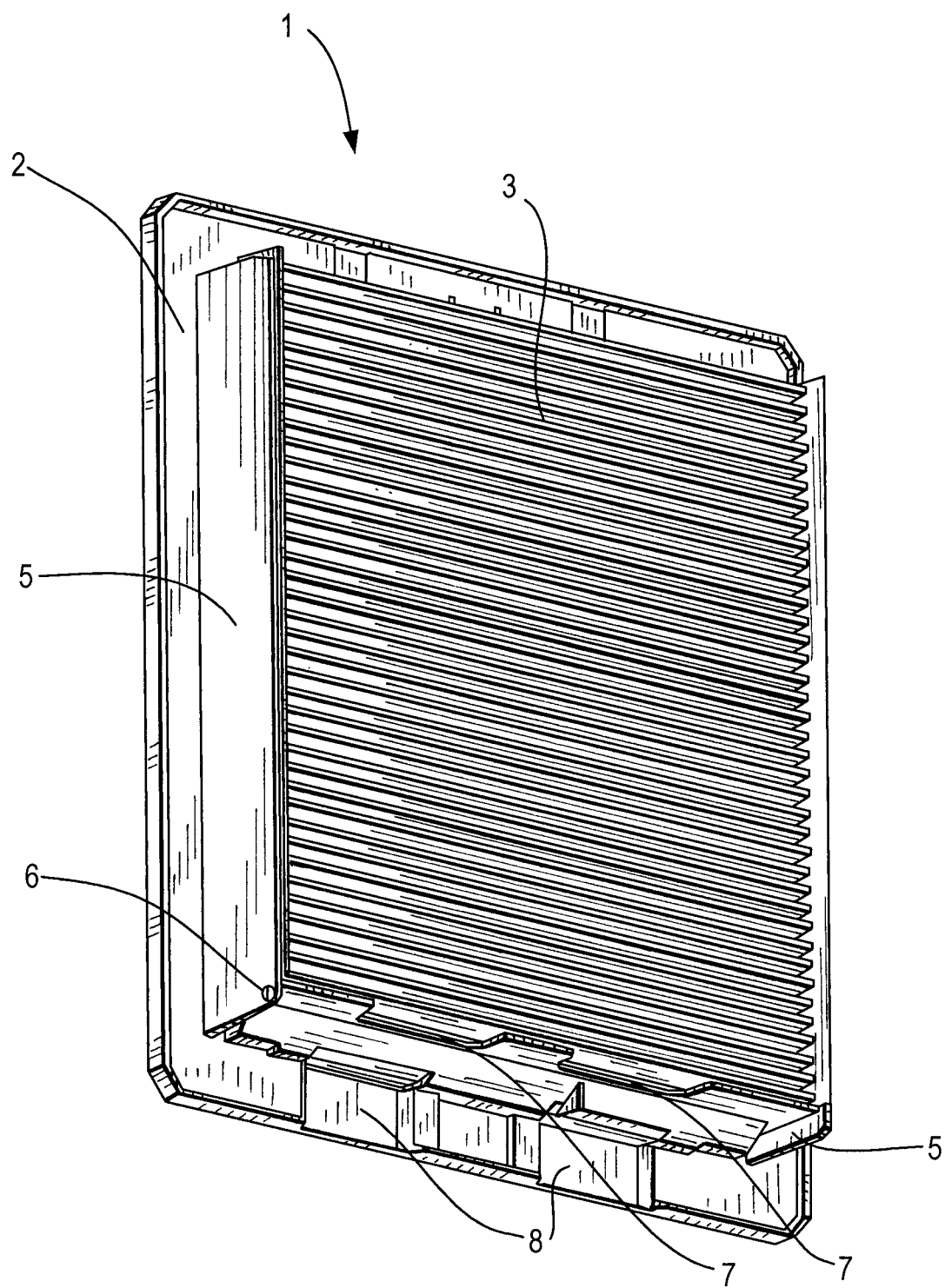
FIG. 2 shows the frame of FIG. 1 in a similar view to FIG. 1 with dismounted protective grid.

FIG. 2 shows the protective cover 1 with removed protective grid. The single folds of the filter element 3 can clearly be seen and two side walls 5 can be recognized which are moulded on the rear side of the covering grid 2 and between which the filter element 3 is. Webs which cause a press fit of the filter element 3 extend to the filter element 3 on the side walls 5 so that the covering grid 2 can be manipulated together with the filter element 3. A guiding pin 6 is provided on the outer faces of the side walls 5, whereby the guiding pin 6 is chamfered to the clean side, thus to the protective grid 4, so that a movement by which the covering grid 2 is pushed onto the protective grid 4 or is inserted into the protected grid 4 is made simpler. This being, corresponding guiding grooves inside the protective grid 4 guide both guiding pins 6. The guiding pins 6 serve as hinge pins, the filter fan being mounted, so that, for a stationary staying filter fan, the front covering grid 2 can be swivelled about the hinge pins as guiding pins 6 and can be swung open to the outside so that an access to the filter element 3 is created from outside the casing in which the filter fan is inserted so that a quick and uncomplicated change of the filter element 3 is made possible with as little expenditure as possible.

In the lower area of the protective grid, on its rear side, the arrangement of two water discharge openings 7 is provided below the filter element 3, whereby the water arrives to water discharge slots 8 which are provided in the lower area of the covering grid 2 so that the water which arrived behind the filter element 3, thus to the clean side of the filter element 3, can flow downwards and be led through the water discharge openings 7 and the water discharge slots 8 to the outside of the casing in which the filter fan is inserted.

Figure 3:
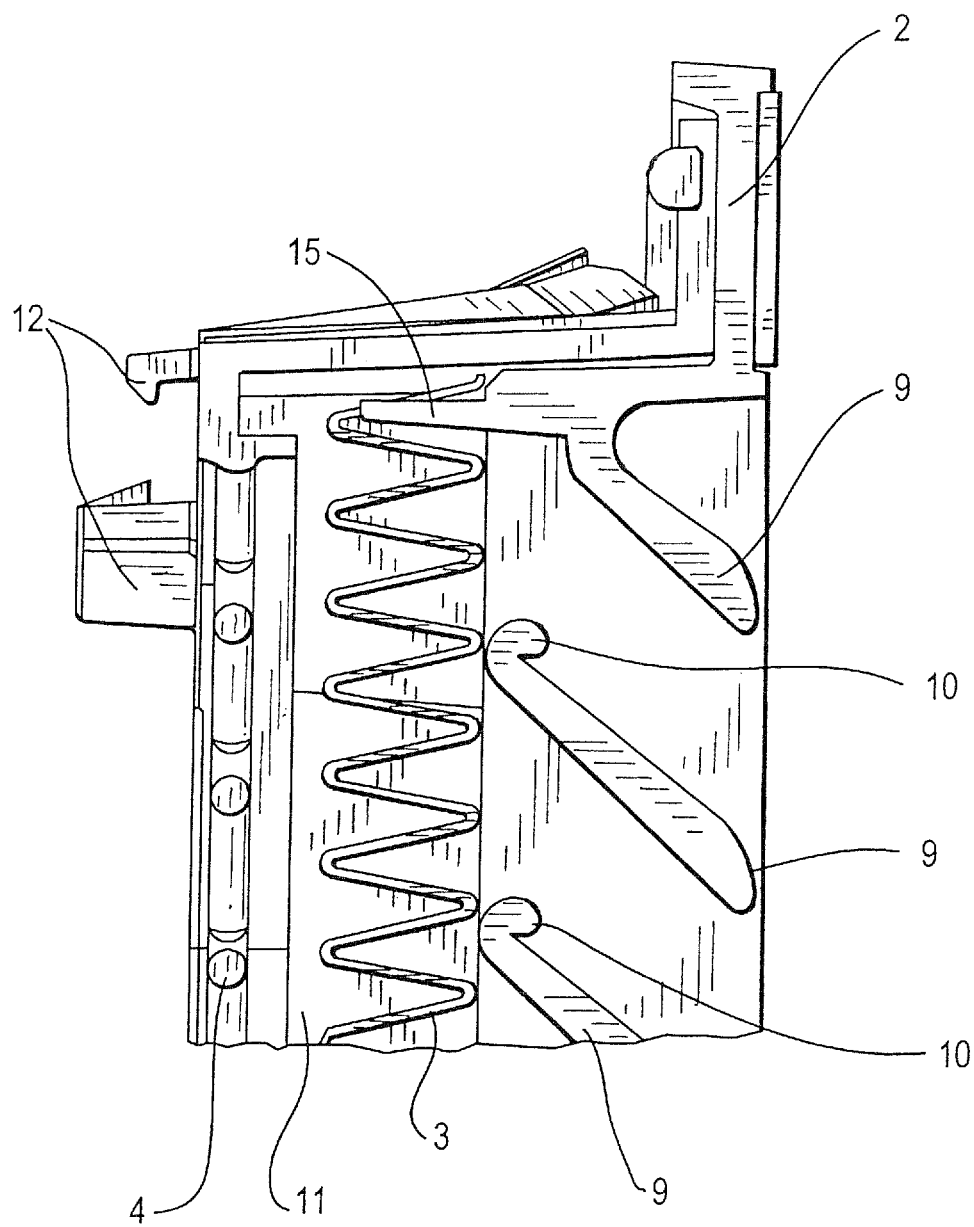
FIG. 3 shows a cutout through the frame of FIG. 1 as a vertical section.

FIG. 3 shows a vertical section through the upper area of the protective cover 1. The covering grid 2 is provided with several lamellae 9. The lamellae 9 are placed oblique and ascend to the filter element 3 so that jet water or atmospheric water arriving onto the lamellae is discharged to the front side or to the outside or to the unclean side of the filter fan.

All the other lamellae 9 except the highest lamella are provided with a rib 10 which is provided on the upper side, namely at the upper end of each lamella 9 and is moulded with a section as a barb so that additionally to the oblique position of the lamella 9 an additional resistance for ascending water is created.

The filter element 3 has on its both sides laminated material strips 11 which reinforce the filter element 3. The material strips 11 are dimensioned so wide that they extend beyond the clean side of the filter element 3. These material strips cause a distance of the filter surface of the filter element 3 to the protective grid 4 so that water which overcome the lamellae 9 and the ribs 10, arrived onto the filter element 3 and passed through the filter element, can now be discharged without pressure on the rear side of the filter element 3. Moisture which trickles down as a thin moisture film on the filter element 3 does not find any contact to the protective grid 4. But even bigger water drops which are formed eventually on the rear side of the filter element 3 do not contact the protective grid, because of the distance between the filter surface of the filter element 3 and the protective grid so that they cannot penetrate through the whole protective cover 1 and cannot arrive to the clean surface of the protective grid 4 or to the blast. The protective grid 4 has several clips elements 12 through which it can be connected with the blast and/or with the casing of the switch cupboard without any tool so that the whole filter fan can be mounted in the casing by means of these clips elements 12. The insertion opening of the casing is sealed by a sealing which can be seen on FIGS. 1 and 3 so that the air access into the inside of the casing substantially takes place only over the filter element 3.

In FIG. 3, it can still be seen that sealing webs 15 are provided on the covering grid 2, whereby the upper sealing web 15 is represented. The sealing web 15 serves for receiving the filter element 3 and extends in the direction in which the folds of the filter element 3 also extend so that the sealing element can be set onto the sealing webs in a simple manner without any tool.

Figure 4:
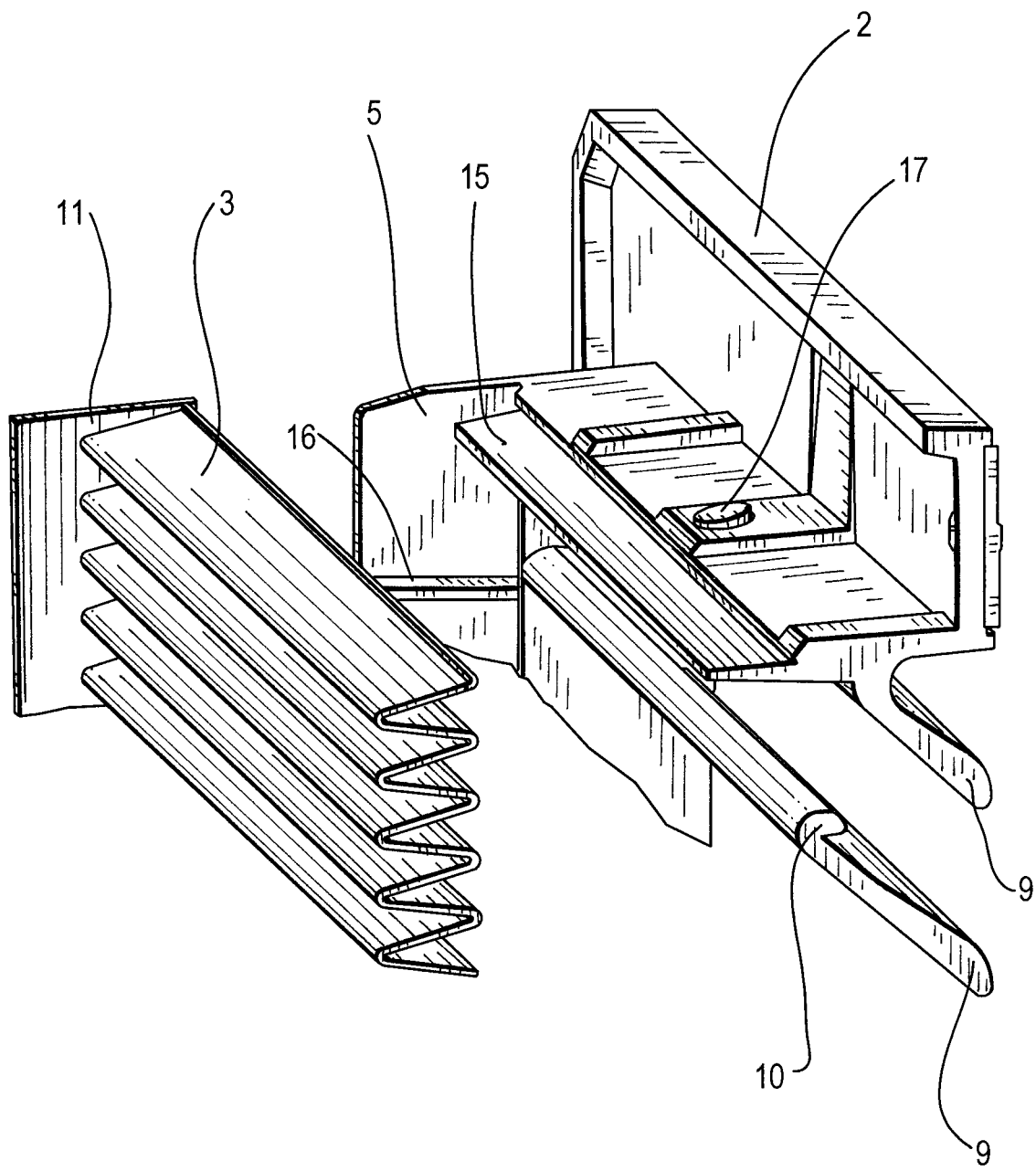
FIG. 4 is a view onto a cutout of the frame of FIG. 2 in an exploded representation.
Figure 5:
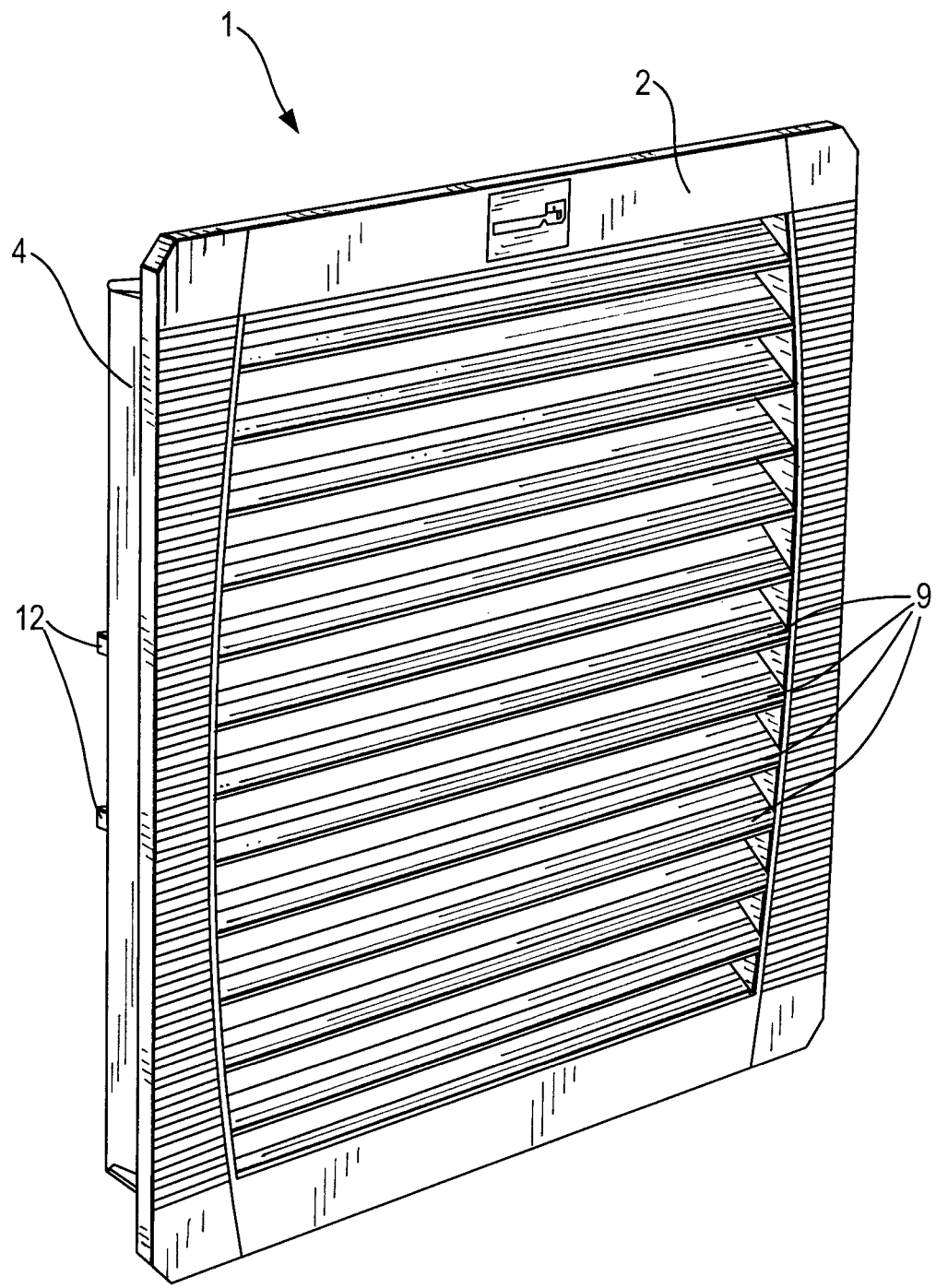
FIG. 5 is a top view, from the unclean side, onto a protective cover of a filter fan.

In FIG. 4, the structure of the filter element 3 with its both lateral material strips 11 can be seen, whereby the filter element 3 is represented in section so that only one of these material strips 11 is represented. The projection of the material strip 11 which is orientated to the clean side, which defines the distance of the filter surface from the protective grid 4, can be clearly recognized in FIG. 4.

Furthermore, FIG. 4 shows a web characterized by 16 which causes the press fit of the filter element 3 between the two side walls 5 and FIG. 4 shows a further clips element 17 which serves for the locking of the covering grid 2 with the protective grid and which is correspondingly configured chamfered in order to make possible an easy snapping-on of the protective grid on the covering grid 2. The covering grid 2 and the protective grid 4 form together a frame surrounding the filter element 3.

While specific embodiments of the invention have been described in detail to illustrate the inventive principles, it will be understood that the invention may be embodied otherwise without departing from such principles.

I claim:

1. A filter fan of a switch cupboard or an electrical and/or electronic device placed in a casing, comprising:
a blower for producing an air flow;
a housing comprising a first wall, a second wall, an upper wall and a lower wall, wherein the first wall of the housing comprises a planar protective grid and a peripheral edge area disposed in a common plane with the protective grid, the peripheral edge area surrounding the protective grid, wherein the second wall is opposite the first wall and comprises a covering grid, the housing being fixable on the casing by covering an air passage opening that penetrates through a casing wall;
a filter element comprising a first surface, a second surface and two opposing narrow sides, the filter element being enclosed in the housing and placed in the air flow and separating a clean side, on which the blower is placed, from an unclean side, and wherein the first filter surface is turned to the clean side and facing the planar protective grid and the second filter surface is turned to the unclean side and facing the covering grid,
wherein the blower is mounted to the planar protective grid from outside of the housing by connecting elements and the filter element is arranged inside the housing parallel to the planar protective grid,
wherein a bridge-free space is provided between the first filter surface of the filter element and the planar protective grid so that there are no distance webs between the first filter surface and the planar protective grid,
wherein distance elements are attached on the two opposing narrow sides of the filter element, the distance elements projecting beyond the first filter surface towards the planar protective grid and resting on the peripheral edge area, wherein a distance of the first filter surface to the protective grid is defined by the distance elements so as to form the bridge-free space between the first filter surface and the planar protective grid, and
wherein the housing has water outlet openings in the lower wall thereof.

2. The filter fan according to claim 1, wherein the filter element (3) has a mean pore size of at least 20 μm.

3. The filter fan according to claim 1, wherein the filter element (3) has a mean pore size between 20 μm and 50 μm.

4. The filter fan according to claim 1, wherein the edge area of the filter element (3) is formed by a material strip (11) which is lined onto a rest of the filter element (3).

5. The filter fan according to claim 1, wherein the filter element (3) is a folded filter.

6. The filter fan according to claim 5, wherein each distance element comprises a material strip (11), each material strip (11) being provided respectively on two opposite sides of the filter element (3), wherein each material strip (11) extends transversely to the folds of the filter element (3).

7. The filter fan according to claim 5, wherein sealing webs (15) which extend in folds of the filter element (3) are provided on the housing.

8. The filter fan according to claim 7, wherein the sealing webs (15) extend into both outest folds of the filter element (3).

9. The filter fan according to claim 5, wherein the folds of the filter element (3) are oriented in a vertical direction.

10. The filter fan according to claim 1, wherein the filter element (3) is formed from a single-layer material width.

11. The filter fan according to claim 10, wherein the filter element (3) is formed from a polyester nonwoven material.

12. The filter fan according to claim 1, wherein the housing has water discharge surfaces extending on its lower wall obliquely downwards to the unclean side.

13. The filter fan according to claim 1, wherein the housing has webs (16) turned to the filter element (3) which hold the filter element (3) clamped on the housing.

14. The filter fan according to claim 1, wherein a covering grid (2) is placed on the unclean side of the filter element (3) which has several air passage openings separated from each other by lamellae, whereby the lamellae (9) extend respectively ascending from the unclean side to the clean side and have on their upper side a moisture barrier which is configured as a rib (10) which extends along the lamella (9) on its upper side.

15. Filter fan according to claim 14, wherein the rib (10) on the upper side of the lamella (9) is oriented as a barb turned to the unclean side.

16. The filter fan according to claim 1, wherein a water discharge channel configured as a siphon is provided on the lower wall of the frame.

17. A filter element of a filter fan placed in an air flow produced by a blower, wherein the filter element comprises a first surface, a second surface and two opposing narrow sides, the filter element separating a clean side, on which the blower is placed, from an unclean side, wherein the filter element is enclosed in a housing which can be fixed on a casing of a switch cupboard or an electrical and/or electronic device by covering an air passage opening penetrating through a casing wall, said housing comprising a first wall, a second wall, an upper wall and a lower wall, wherein the first wall of the housing comprises a planar protective grid and a peripheral edge area disposed in a common plane with the protective grid, the peripheral edge area surrounding the protective grid, wherein the second wall is opposite the first wall and comprises a covering grid, and wherein the filter element has a first filter surface turned to the clean side and facing the planar protective grid and a second filter surface turned to the unclean side, wherein a bridge-free space is provided between the first filter surface of the filter element (3) and the planar protective grid (4) so that there are no distance webs between the first filter surface and the planar protective grid, and, wherein distance elements are attached on the two opposing narrow sides of the filter element, the distance elements projecting beyond the first filter surface towards the planar protective grid and resting on the peripheral edge area, wherein a distance of the first filter surface to the protective grid is defined by the distance elements, so as to form the bridge-free space between the first filter surface and the planar protective grid, and wherein the housing has water outlet openings in the lower wall thereof.

* * * * *